(12) United States Patent
Hoover et al.

(10) Patent No.: US 6,628,391 B2
(45) Date of Patent: Sep. 30, 2003

(54) METHOD FOR ALIGNING TWO OBJECTS (76) Inventors: Rex Hoover, 5263 Stewart Rd., Sumerduck, VA (US) 22742; Robert G. Hoover, 5263 Stewart Rd., Sumerduck, VA (US) 22742; Thomas A. Hoover, 5263 Stewart Rd., Sumerduck, VA (US) 22742

( * ) Notice: Subject to any disclaimer, the term of this patent is extended or adjusted under 35 U.S.C. 154(b) by 302 days.

(21) Appl. No.: 09/852,318

(22) Filed: May 11, 2001

(65) Prior Publication Data

US 2001/0030747 A1 Oct. 18, 2001

Related U.S. Application Data

(63) Continuation-in-part of application No. 09/399,087, filed on Sep. 20, 1999, now Pat. No. 6,327,034.

(51) Int. Cl.⁷ .......................... G01B 11/00; G03B 27/62; G03B 27/42
(52) U.S. Cl. .......................... 356/400; 356/401; 355/75; 355/53
(58) Field of Search ................. 356/399–401; 355/75, 53, 55, 77; 430/22, 311

(56) References Cited

U.S. PATENT DOCUMENTS

| | | | | |
|---|---|---|---|---|
| 5,905,566 A | * | 5/1999 | Comulada et al. | 355/73 |
| 6,087,053 A | * | 7/2000 | Hara | 430/30 |
| 6,232,023 B1 | * | 5/2001 | Matsuki et al. | 430/22 |
| 6,327,034 B1 | * | 12/2001 | Hoover et al. | 356/400 |

* cited by examiner

*Primary Examiner*—Russell Adams
*Assistant Examiner*—Andrew Sever
(74) *Attorney, Agent, or Firm*—C. C. Shroff; Papan Deynani, Esq.

(57) ABSTRACT

A system for aligning a mask and a product with high precision, featuring a means for supporting a product in a fixed position and a mask adjacent to the product so that the mask is movable relative to the product. A plurality of computer controlled plungers push the surrounding mask frame into alignment. A computer is used to determine the relative position of the mask and the product prior to alignment; and that, to achieve proper alignment of the mask and the product, and determines the distance that the mask must be moved.

6 Claims, 8 Drawing Sheets

METHOD FOR ALIGNING TWO OBJECTS

REFERENCE TO RELATED APPLICATION

This application is a Continuation-in-Part of Ser. No. 09/399,087 filed on Sep. 20, 1999 now U.S. Pat. No. 6,327,034.

FIELD OF THE INVENTION

The field of the invention relates to an improved apparatus for automatically and precisely aligning two superimposed objects (i.e., aligning a semiconductor wafer or other substrate coated with photoresist material with a mask), and to a method of aligning objects using the apparatus.

BACKGROUND ART

In the present day manufacture of integrated circuits, complex circuit patterns are formed on a silicon wafer by photoresist techniques employing a series of contact printings on the wafer. These contacts printings are made from several transparent masks used in succession and in a preselected order. Each successive mask must be accurately aligned with the previous print or prints made on the wafer from the prior masks so that the completed pattern is accurate within a few microns.

The alignment of each mask with the wafer may be accomplished manually by manipulation of the mask over the wafer while the operator observes the mask and wafer through a high power microscope. Alignment may be aided by the use of a pair of spaced-apart detection marks or alignment patterns, for example, crosses, bull's-eyes, or pinpoint alignment holes, formed on each of the wafer and mask, the pair of alignment patterns on the mask being arranged so that they are superimposed over and aligned with the pair of alignment patterns on the wafer when the wafer and mask are properly aligned.

Apparatus has been proposed for producing alignment of the mask and wafer automatically, thus relieving the operator of this tedious task. One form of such automatic apparatus is described in U.S. Pat. No. 3,497,705 issued Feb. 24, 1970, to A. J. Adler and entitled "Mask Alignment System Using Radial Patterns And Flying Spot Scanning". In that system a pair of spaced-apart radial alignment patterns on the wafer is adapted for alignment with a superimposed pair of spaced-apart radial alignment patterns on the transparent mask. The radials of the alignment patterns on the mask are uniformly angularly displaced relative to the radials of the alignment patterns on the wafer when the mask and wafer are properly aligned. A scanning system employing two flying spot scanners scans each of the two pairs of alignment patterns in a circular manner about a center point, measuring the angular distance between the successive radials encountered by the scanning beam. Error signals derived from misalignment of the radials of the alignment patterns on the mask relative to the radials of the alignment patterns on the wafer are utilized to produce relative movement in X, Y, and rotational directions to bring the two pairs of alignment into proper alignment.

Karlson et al., in U.S. Pat. No. 4,052,603, published Oct. 4, 1977, discloses a system for aligning a pattern mask and a photoresist-coated substrate which are separated by an optical element which involves a system for correcting misalignment in the x-or y-directions between the mask and the substrate by using stepper motors to move the substrate in the x-direction or in the y-direction relative to the mask. Rotational misalignment is corrected using a separate mechanism involving gears and levers to rotate the mask relative to the substrate. This apparatus involves use of two separate systems simultaneously to achieve successful alignment, and is rather complicated. It would be desirable to have a system which moves the mask relative to a fixed substrate, rather than moving both the mask and the substrate relative to each other. It would also be desirable to achieve rotational motion and motion in the x-direction or in the y-direction relative to the substrate with a single mechanism, rather than with two separate mechanisms.

SUMMARY OF THE INVENTION

The objects of the invention are to provide an improved apparatus for bringing two products into alignment with high precision, and to provide a method for using the apparatus to successfully align two objects.

The invention provides a system for aligning a product, such as a semiconductor wafer or other substrate coated with a photoresist material, and a mask with high precision. The mask has a plurality of detection marks, and the product has a plurality of corresponding detection marks. When the mask and the product are properly aligned, each of the mask detection marks is precisely aligned with the appropriate product detection mark. The system features a product securing surface, where the product securing surface may be made from a transparent having porous sections therethrough adapted to support the product, a means for securing the product to the plate by applying vacuum to the product through the porous sections, and at least two registration pins adapted to fit through registration holes in the product. The invention also features a surface for positioning a mask. Normally, the mask is surrounded by a rectangular mask frame having at least two holes in it. The mask frame is positioned on the mask positioning surface. The mask positioning surface features a holding plate adapted to support the mask frame and at least two alignment pins adapted to fit through alignment holes in the mask frame. In the embodiment described herein, the transparent plate and its porous sections are a recessed portion of the holding plate supporting the mask frame.

After the mask frame is placed on the positioning surface, a number of plungers are activated to resiliently press against two perpendicular edges of the mask frame. These plungers serve to prevent inadvertent or accidental movement of the mask frame and, in the embodiment described herein, are three in number. Computer controlled push plates, also three in number in the present contemplated embodiment, provide the necessary movements to align the corresponding detection marks on the mask frame and the product. In the contemplated embodiment one push plate is set opposite one of the plungers and the remaining pair of push plates are disposed opposite the remaining plungers. Given an arbitrary Cartesian coordinate system imposed on the mask frame and product, sat the single push plate and the corresponding plunger represent movement along the x-axis. Thus, it should be clear that movement along the y-axis is accomplished by synchronous movement of both the other push plates in the desired direction. If rotation is required for alignment, all three push plates may be moved simultaneously using mathematic additions of each individual calculated movement distance.

The system additionally features an imaging means comprising a video camera and an optical microscope adapted to focus an image of the mask and/or the product onto the imaging plane of the video camera. The video camera records an image of each of the detection marks on the product and an image of the detection marks on the mask, and transmits these images to a computer.

The computer then records the position of each of the detection marks on the product; and also records the position of the detection marks on the mask. The computer then compares the positions of the respective detection marks to each other and determines that, to bring the detection marks into alignment with each other the mask needs to be moved in a first direction by a first distance and moved in a second direction by a second distance, and rotated by a defined amount. This can be accomplished be either moving all three simultaneously or by moving them one at a time. It should be noted that the distances involved would be measured in micrometers due to pre-positioning allowed for by the initial positioning pins, as will be discussed further below.

DETAILED DESCRIPTION OF THE PREFERRED EMBODIMENT

Figure 1:
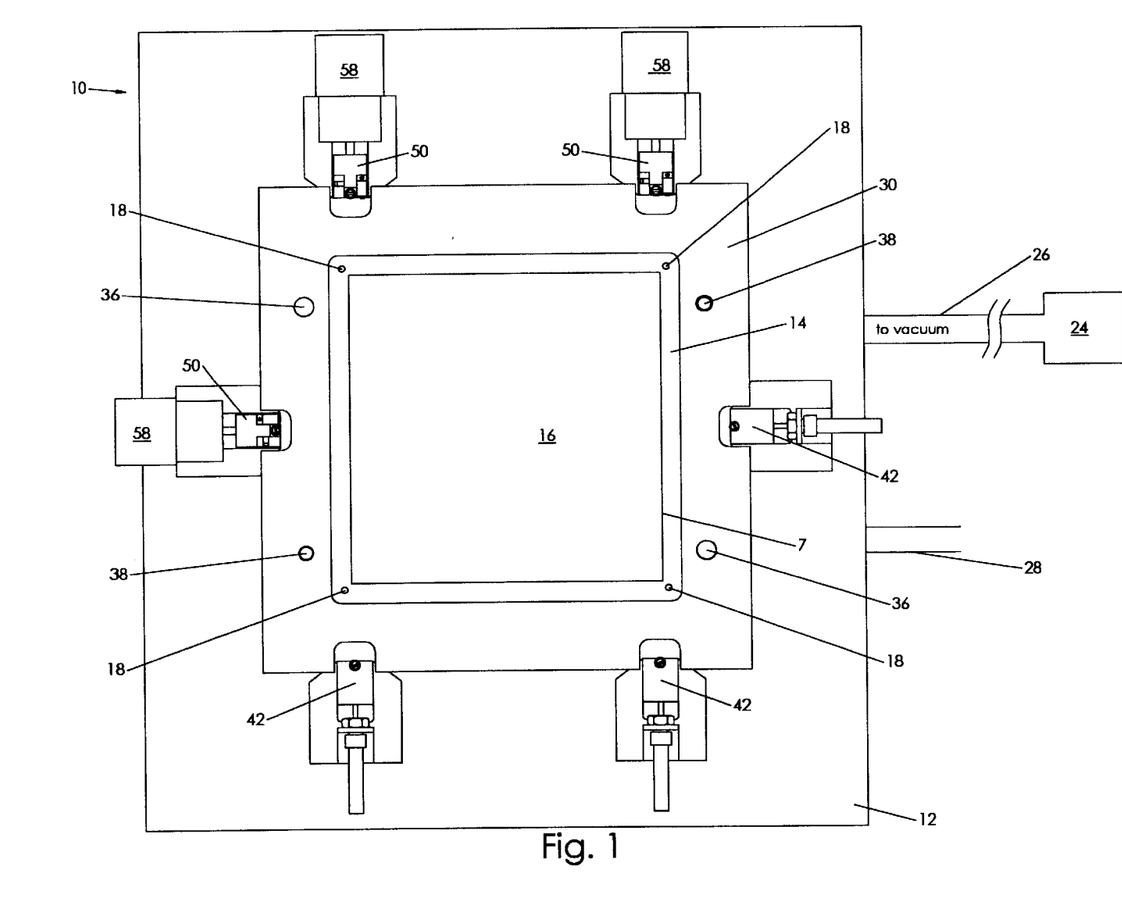
FIG. 1 shows an alignment tool for use in the inventive system with neither the product or the mask in place

Turning first to FIG. 1, the mask alignment portion of the invention is indicated generally at 10. The stage top plate is indicated at 12. The product securing surface is indicated at 14 and is disposed between 0.01 and 0.1 inch below the rest of the top plate 12 to prevent the product and the mask from touching one another as they are brought into alignment. The central part of the product securing surface as denoted at 16, is transparent and, in part at least, is porous, as will be discussed further below. At the outer margins of this porous surface are retractable registration pins 18. The flat product, such as a green sheet, a semiconductor wafer, or other flat type of product is positioned on the surface 16 by placing the retractable pins 18 through corresponding holes (indicated at 20 in FIG. 2) in the product. The product 22 is seen placed on the surface 16 in FIG. 2. After the product 22 is placed on the surface 16, a vacuum is applied from a vacuum chamber 24 through a tube 26. The product securing surface, as mentioned above, is porous, and in the contemplated embodiment is made from a material such as Porex, a ceramic material that allows the vacuum to be applied while maintaining rigidity. As mentioned, a portion of the surfaces 14 and 16 would be light transmitting that would allow for a ring illuminator, or similar light source to be placed underneath plate 12 and enables the user of the apparatus 10 to see the various detection marks (as will be discussed further below) on the product and the mask. The light could be supplied through a fiber optic conduit such as indicated at 28 in FIGS. 1, 2, and 3 and will be discussed further below. As mentioned above, the product 22 is seen placed on the securing surface 16 in FIG. 2. Outside this securing surface 16 is the mask frame support surface 30. This allows for the placement of the mask 32, seen placed on the apparatus 10 in FIG. 3. The mask has a central portion 34 that substantially covers the product 22 and further includes mask frame holes 35. Note in FIGS. 1 and 2 the dual sets of alignment pins 36 and 38. Retractable rough alignment pins 36 are seen on opposing corners of the mask frame support surface 30. On the other set of corners are the fixed fine alignment pins, which are threaded and allow the user to secure the mask 32 by screwing down securing nuts, or the like, indicated at 40 in FIG. 3. It should be noted that in the Figs. the size of the holes 20, 35 on the product and the mask along with the size of the various pins is exaggerated for clarity. Thus, at this point in the process, the product 22 and the mask 32 are generally in alignment with one another and now the process of fine, exact alignment can begin.

Figure 2:
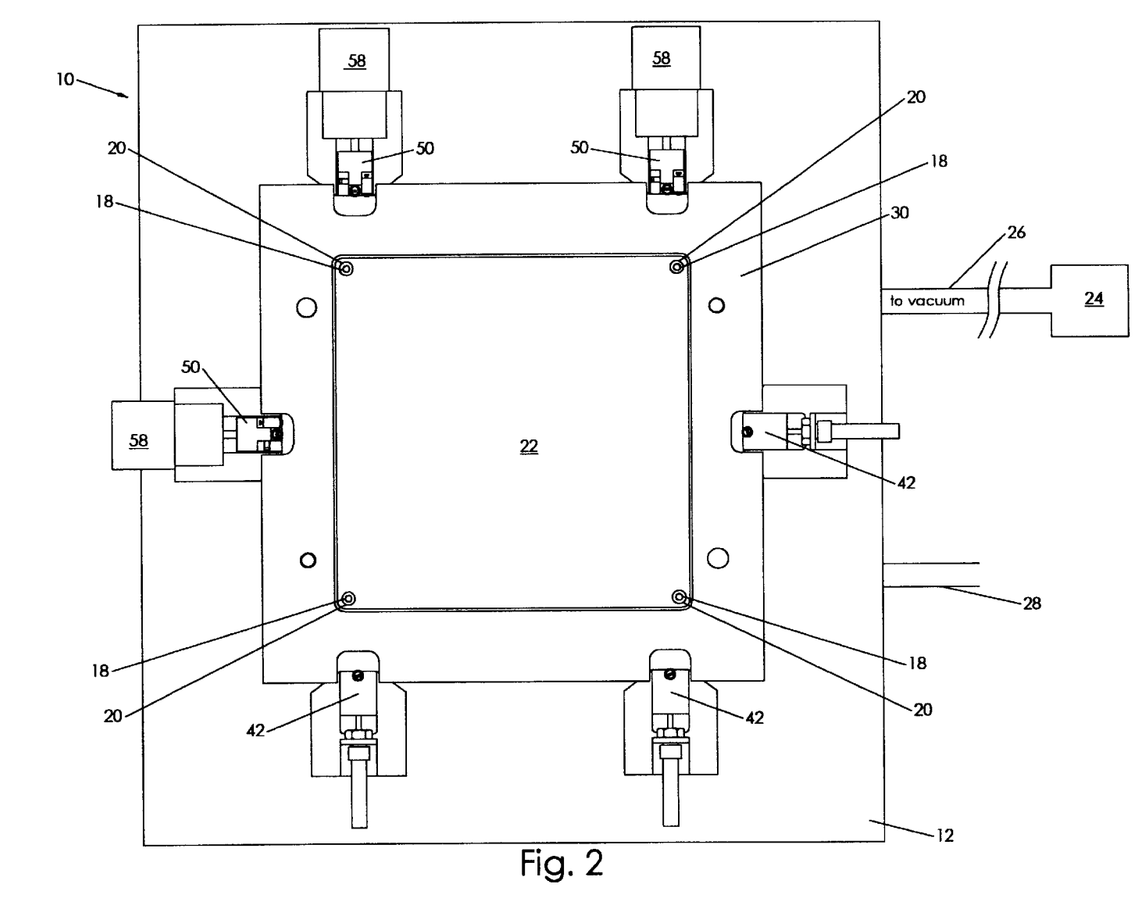
FIG. 2 shows an alignment tool for use in the inventive system with a product positioned thereon.
Figure 3:
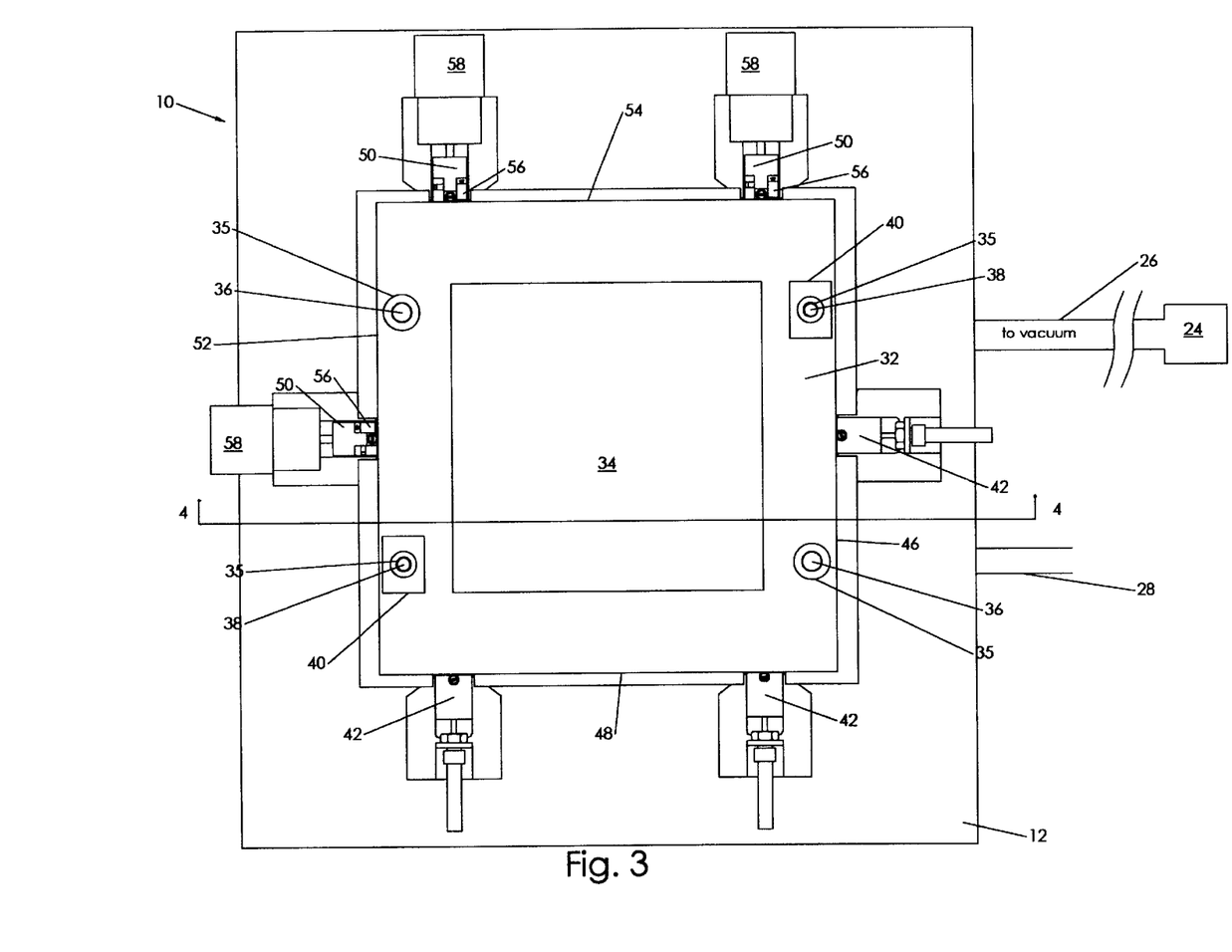
FIG. 3 shows an alignment tool for use in the inventive system with a mask positioned thereon.

Note that in FIGS. 1, 2, and 3 there are seen resilient plungers 42 and push plate 50. These will now be discussed in more detail. Resilient plungers 42 are preferably run on compressed air supplied by the user but any number of other methods of urging them against mask 32, as seen in FIG. 3, may be used. They could, for instance, be spring biased. The plungers 42 are held against the mask 32 with enough to force to prevent any inadvertent movement. Note that in the embodiment seen herein, the plungers 42 are arranged with a single plunger on the side indicated at 46 of the mask 32. Perpendicular and next to side 46 is side 48. On side 48 there are disposed a pair of the plungers 42. Opposite the single plunger 42 is a single push plate 50 located on the side of the mask indicated at 52. In a similar manner, opposite side 48 with its accompanying pair of plungers 42 is side 54, perpendicular to side 52 and having a pair of push plates, both indicated at 50. With this arrangement of the plungers 42 and the push plates 50, the mask 32 and the product 22 may now be brought into precise alignment. Located at the end of each of the push plates 50 are limit switches 56. These are actuated on contact with the surface of the mask 32 and may be photoelectric switches, differential pressure switches, or spring-actuated switches. In any case, when contact with the edge of the mask 32 is made, power is cut off to the stepper motors 58 that drive the push plates. The stepper motors are preferably electronically driven 0.45 degree motor. This allows a resolution of approximately 0.5 micrometers per step. Please note that the movement of the mask may be accomplished by either moving the push plates forward or by moving them backwards, which allows the resilient plungers to move the mask in the desired direction.

A computer, seen in FIGS. 6 and 7 records the position of the push plates when they contact the mask and this allows for calculations that will. be discussed further hereinbelow in regard to the fine alignment process.

Figure 4:
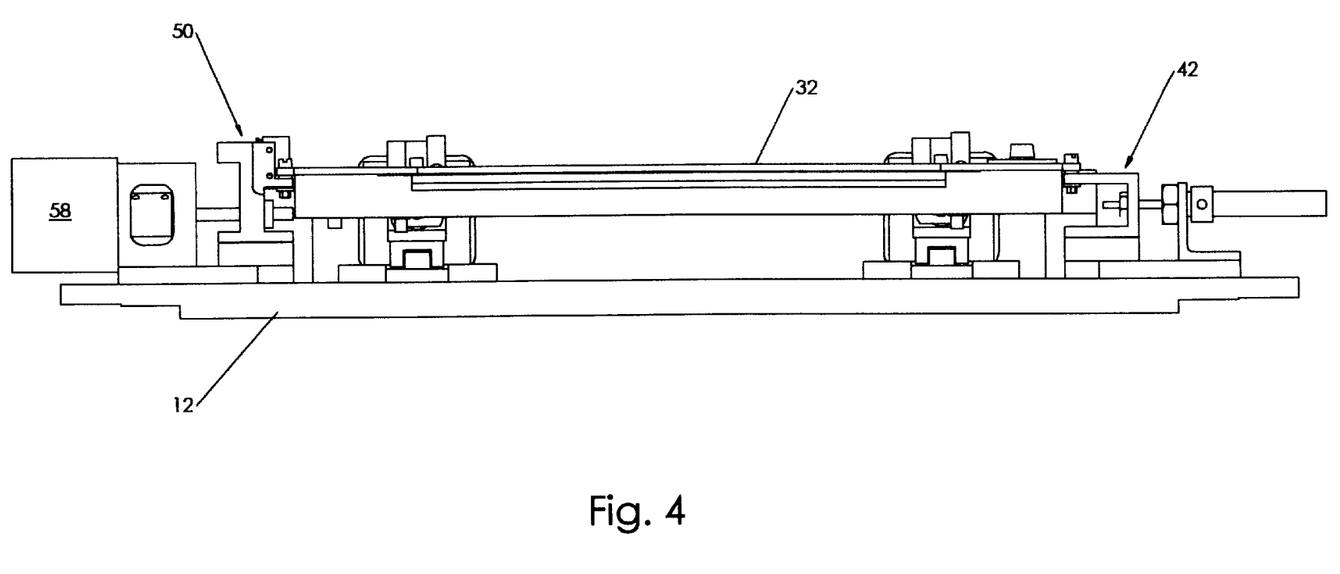
FIG. 4 is a side view taken along line 4—4 in FIG. 3.
Figure 5:
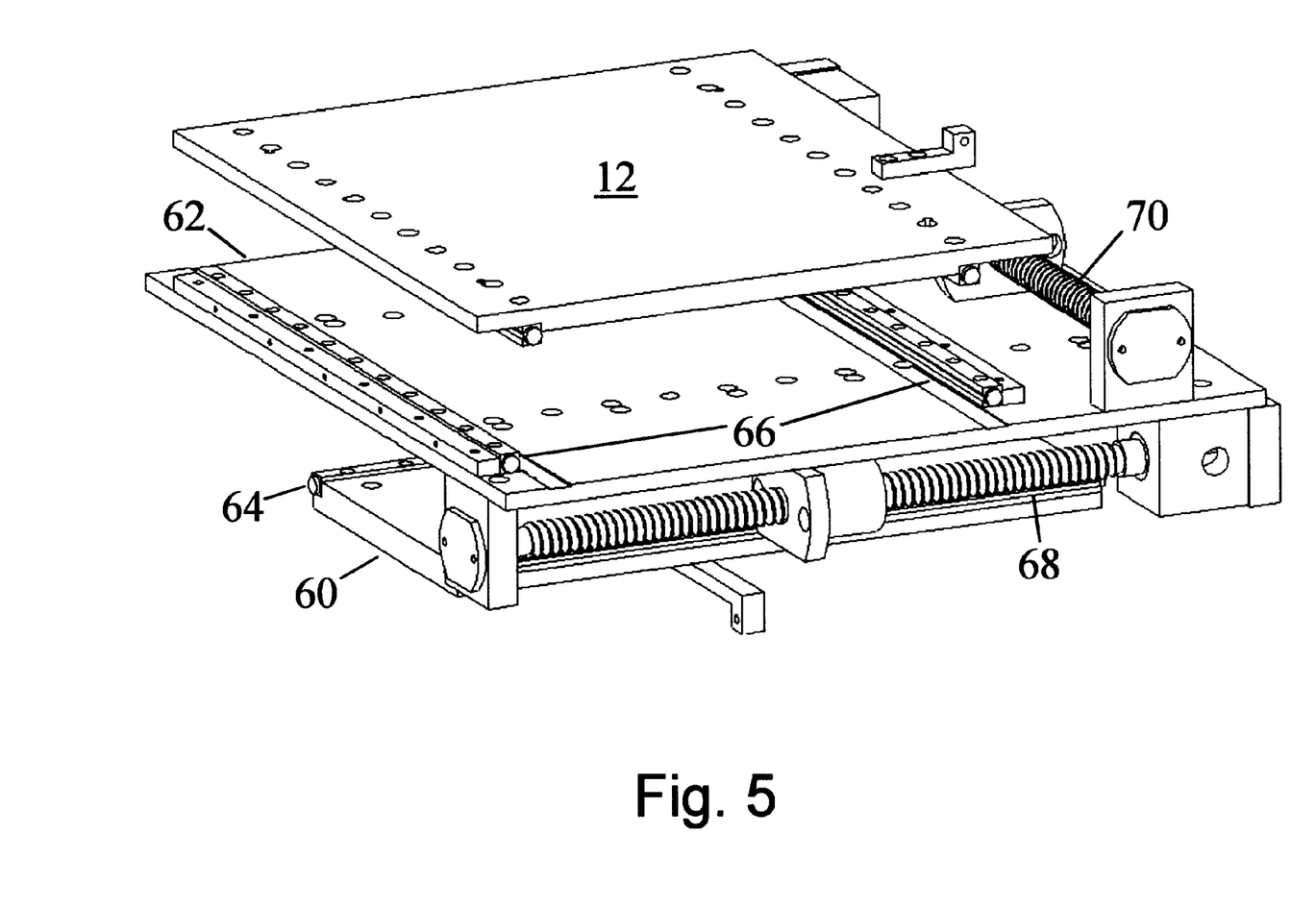
FIG. 5 shows an exploded view of a stage suitable for supporting the tool of FIG. 1.

The discussion now turns to the stage assembly of the apparatus. This is seen in FIGS. 4 and 5 in the drawings. The alignment tool 10 is positioned on the top stage plate 12. Bottom plate 60 is attached to a tabletop or the like (not shown) and a second plate 62 is then mounted on the bottom plate using linear bearings or the like indicated at 64. The top plate 12 is then in turn located on the second plate 62 using another set of bearings indicated at 66. These bearings 64, 66 allow the top plate 12 to move in an X-Y direction controlled by the computer to bring the workpiece into the desired position. It is contemplated that stepper motors driving horizontally threaded screws 68, 70 would accomplish this.

Figure 6:
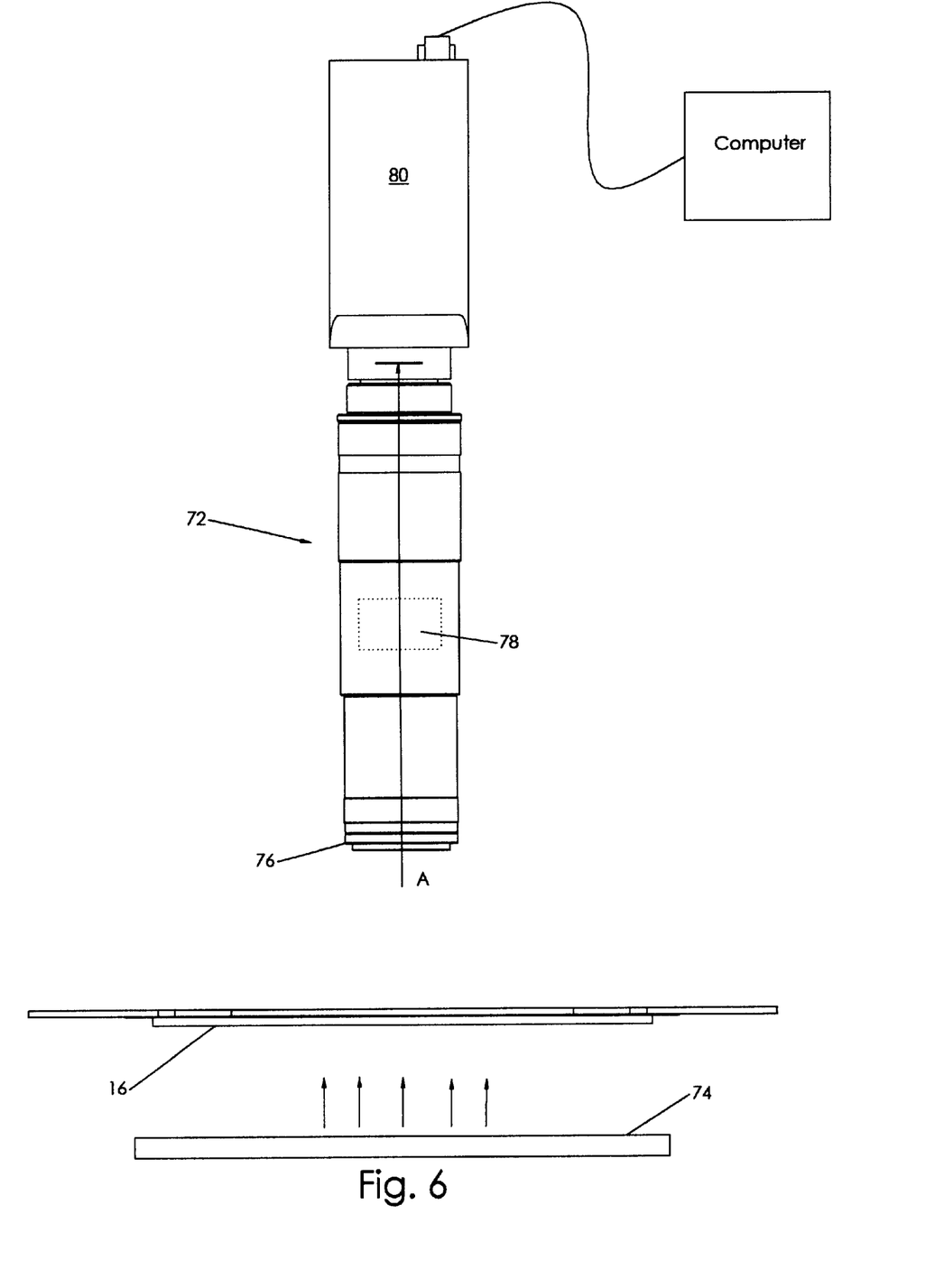
FIGS. 6 and 7 show two microscopes that may be used in conjunction with the tool of FIG. 1.
Figure 7:
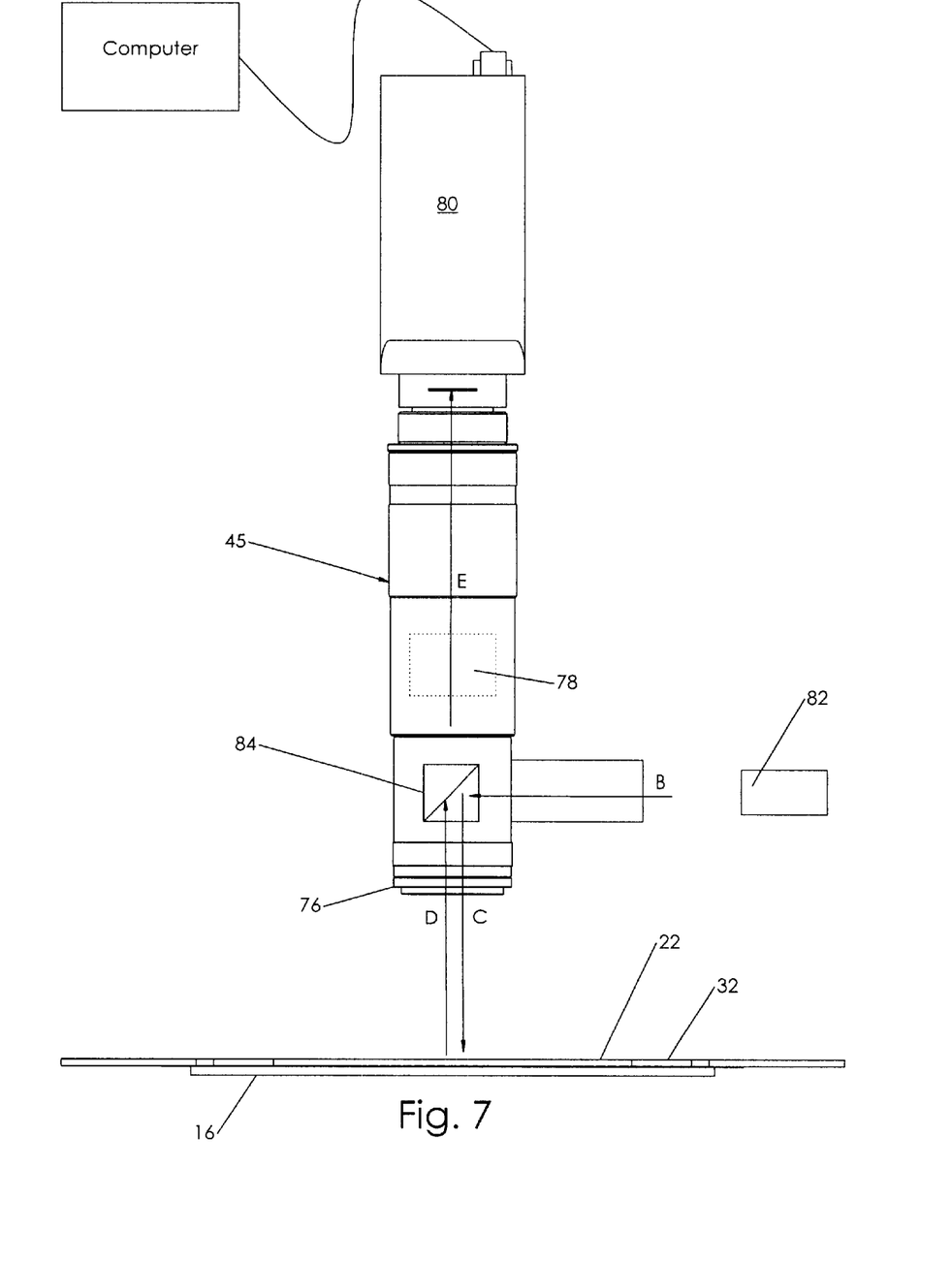
Figure 8:
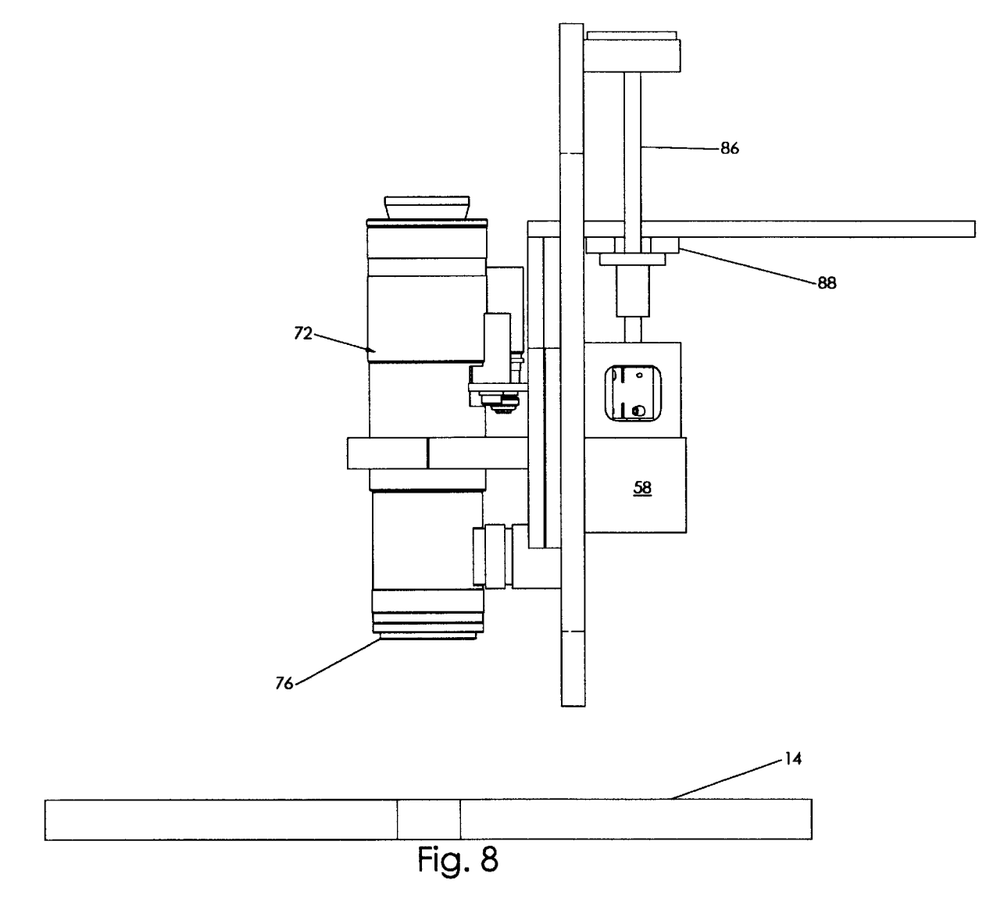
FIG. 8 shows a mechanism for adjusting the focus of the microscope.

Turning now to FIGS. 6, 7, and 8, the optical assembly of the present invention will be discussed. In the Figs. the microscope, indicated at 72, can be used with first, as seen in FIG. 6, a light transmissive system, that includes the light source 74. The light would travel in the line as indicated at A and through the transparent and partially porous surface 16. The light passes through the objective lens 76 and then the image is focused through the lens system indicated at 78 onto the imaging plane of the video camera 80. This image is then transmitted to the computer as indicated in the Figures. Turning to FIG. 7, in the case that mask and product could be opaque, they could be illuminated by reflected light directed through the side of the microscope 72 as indicated by line B from a light source seen at 82. The light beam reflects off a splitter 84, passes in turn through the objective lens 76, off of mask and product 32, 22, and then is focused onto the image plane of the camera 80 and transmitted to the computer. Travel to provide focus for the microscope 72 is seen in FIG. 8. Stepper motor 58 drives vertical threaded screw 86 carrying the microscope 72 up and down as desired (preferably through computer control) by means of the bracket 88. The distance that the microscope 72 is from product securing surface 14 may be saved in memory so that the computer can return the microscope 72 to the same position in the case of a similar product and mask.

The operation of the alignment system will now be described. Initially, the retractable registration pins 18 are in position and the product 22 that includes a plurality of detection marks thereon is positioned on the porous surface on these pins. A vacuum is then applied through the porous surface 16 and the pins 18 are then retracted. By moving the stage top plate 12 by means of the stepper motors and the associated threaded screws 68, 70, one of the aforementioned detection marks is focused on and transmitted to the computer which records the location of this mark in relation to one of the edges of the porous plate 16 or a reference grid imprinted on the porous plate 16. The various detection marks are brought into the field of view of the microscope, transmitted to the computer, and subsequently recorded. The same process, with the detection marks on the mask, is also performed. The mask 32 is first placed on the retractable rough alignment pins 36 and the fixed fine alignment pins 38. Pins 36 are then retracted. After the computer has recorded the position of the respective alignment marks on the product 22 and the mask 32, the positions are compared and, using analytic geometry, a calculation is made to determine what movements are necessary to achieve the desired alignment between the mask 32 and the product 22. By using the stepper motors 58 and their associated push plates 50, which are secured against the edges of the mask 32, along with the plungers 42, the mask 32 may be moved in a X or Y direction (arbitrarily arrived at by the imposition of a Cartesian coordinate plane onto the securing surface 14) or the mask 32 may be rotated by moving two or three of the push plates 50 simultaneously. As explained above, the resilient plungers will act as prime movers if the stepper motors 58 are used to move the push plates 50 away from the edges of the mask 32. Finally, the nuts 40 are tightened, securing the mask 32 alignment with the product 22.

Thus, the instant invention is useful in various capacities in materials science such as semiconductor technology.

What is claimed is:

1. A method of aligning a mask having a plurality of first detection marks, said mask being positioned in a mask frame, with a product having a plurality of second detection marks so that each first detection mark is aligned with a second detection mark, comprising the steps of:
    i) positioning the product on a porous plate having registration pins thereon by fitting each of the registration pins through a corresponding hole in the product and securing the product in position by applying a vacuum to the product through the porous plate;
    ii) determining the position of each second detection mark on the product;
    iii) positioning the mask over the product by placing the mask frame on a mask supporting plate having at least two alignment pins thereon, said porous plate being a recessed portion of said mask supporting plate, by fitting each of said at least two alignment pins through a corresponding hole in the mask frame;
    iv) causing at least one movable first plunger to press against a first edge of the mask frame;
    v) causing two movable second plungers to press against a second edge of the mask frame, said second edge being perpendicular to said first edge;
    vi) determining the position of each first detection mark on the mask;
    vii) moving at least one first computer-controlled movable push plate against a third edge of the mask frame, said third edge being parallel to said first edge;
    viii) moving two second movable computer-controlled push plates against a fourth edge of the mask frame, said fourth edge being parallel to said second edge;
    ix) determining that, to align each first detection mark with one second detection mark, the mask must be moved toward said at least one first plunger by a first distance;
    x) determining that, to align each first detection mark with one second detection mark, the mask must be moved toward the second plungers by a second distance;
    xi) determining that, to align each first detection mark with one second detection mark, the mask must be rotated by a defined amount;
    xii) signaling said at least one first computer-controlled movable push plate to push the mask frame toward said at least one first plunger for said first distance;
    xiii) signaling all of said two second computer-controlled movable push plates to push the mask frame toward said second plungers for said second distance; and
    xiv) signaling said two second computer-controlled movable push plates to rotate the mask frame by said defined amount, wherein said rotation is accomplished by moving each of the movable push plates toward a corresponding one of the movable plungers, while simultaneously moving another of the second movable push plates away from its corresponding said second plungers, wherein the movement is calculated by geometry and trigonometry.

2. The method of claim 1, wherein, after vacuum is applied to the product, the registration pins are retracted beneath the surface of the porous plate.

3. The method of claim 1, wherein the mask frame has two coarse alignment holes and two fine alignment holes, and the step of positioning the mask over the product is accomplished by:
    placing the mask frame on a mask supporting plate having two fixed alignment pins and two retractable alignment pins thereon, said retractable alignment pins being retracted beneath the surface of the mask supporting plate, by fitting each of said two fixed alignment pins through a corresponding coarse alignment hole in the mask frame; and
    elevating the retractable alignment pins above the surface of the mask supporting plate until they each pass through a fine alignment hole in the mask frame.

4. The method of claim 1, wherein the porous plate is light-transmitting, and wherein the mask supporting plate is mounted on a stage which is adapted to move the mask supporting plate in a horizontal plane.

5. The method of claim 4, wherein the step of determining the position of each second detection mark on the product is performed by:
  i) positioning a microscope having a defined field of view over the porous plate, said microscope being adapted to focus an image of the product on the porous plate to the imaging plane of a video camera;
  ii) moving the mask supporting plate in said horizontal plane so as to bring one of the second detection marks into the field of view of the microscope, which then focuses an image of said one of the second detection marks onto the imaging plane of the video camera;
  iii) transmitting the image of said one of the second detection marks from the video camera to a computer, which records the position of said one of the second detection marks; and
  iv) repeating steps (ii) and (iii) for each remaining second detection mark.

6. The method of claim 5, wherein the step of determining the position of each first detection mark on the mask is determined by:
  i) positioning the mask above the product;
  ii) moving the mask supporting plate in said horizontal plane so as to bring one of the first detection marks on the mask into the field of view of the microscope, which then focuses an image of said one of the first detection marks onto to the imaging plane of the video camera;
  iii) transmitting the image of said one of the first detection marks from the video camera to a computer, which records the position of said one of the first detection marks; and
  iv) repeating steps (ii) and (iii) for each remaining first detection mark.

* * * * *